(12) United States Patent
Kim

(10) Patent No.: US 6,858,490 B2
(45) Date of Patent: Feb. 22, 2005

(54) METHOD FOR MANUFACTURING MERGED DRAM WITH LOGIC DEVICE

(75) Inventor: Hyung Sik Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 54 days.

(21) Appl. No.: 10/610,248

(22) Filed: Jun. 30, 2003

(65) Prior Publication Data

US 2004/0126987 A1 Jul. 1, 2004

(30) Foreign Application Priority Data

Dec. 26, 2002 (KR) .................... 10-2002-84398

(51) Int. Cl.[7] ........................... H01L 21/8242
(52) U.S. Cl. .................. 438/239; 438/253; 438/396
(58) Field of Search .................. 257/307, 308, 257/309, 532, 296, 300, 303, 306; 438/239, 241, 250, 253, 254, 255, 393, 396, 397, 398

(56) References Cited

U.S. PATENT DOCUMENTS

| | | | | |
|---|---|---|---|---|
| 5,453,396 A | | 9/1995 | Gonzalez et al. ........... 438/239 |
| 5,843,817 A | * | 12/1998 | Lee et al. ................... 438/229 |
| 6,080,632 A | * | 6/2000 | Chao ........................... 438/397 |
| 2002/0135029 A1 | | 9/2002 | Ping et al. .................. 257/401 |
| 2002/0137269 A1 | | 9/2002 | Ping et al. .................. 438/197 |

* cited by examiner

Primary Examiner—Hoai Pham
(74) Attorney, Agent, or Firm—Ladas & Parry LLP

(57) ABSTRACT

In manufacturing merged DRAM with a logic device in a single chip, an oxide layer and a nitride layer are formed on a semiconductor substrate. A hole for exposing the substrate is formed. A silicon epitaxial layer is grown on a portion of the substrate exposed by the hole and an adjacent portion of the nitride layer so that a facet is formed on the nitride layer surface. A thermal oxide layer is grown on the silicon epitaxial layer. The thermal oxide layer is wet etched so that only a growing portion is left on the silicon epitaxial layer. The thermal oxide layer left on the facets of the repeatedly grown silicon epitaxial layer is removed. A gate oxide layer and a gate conductive layer are formed on the resulting substrate. A gate is formed by patterning the gate conductive and oxide layer. A capacitor having a storage node, a dielectric layer, and a plate node is also formed.

5 Claims, 6 Drawing Sheets

METHOD FOR MANUFACTURING MERGED DRAM WITH LOGIC DEVICE

BACKGROUND OF THE INVENTION

1. Field of the Invention

The present invention relates to a method for manufacturing a merged DRAM with a logic (MDL) device, and more particularly to a method for forming a high-capacity DRAM capacitor.

2. Description of the Prior Art

In recent years, much interest has been drawn to a semiconductor device having a DRAM and a logic device integrated on a single chip. This is because the integration of the DRAM and the logic device on the single chip allows a high-speed driving at a low rate of power consumption in comparison with conventional chips. However, the semiconductor device has a drawback in that, with respect to the integration of the DRAM and the logic device on the single chip, the size of a chip is increased, the manufacturing process is complicated, and manufacturing yield is low.

A semiconductor device having a DRAM and a logic device on the single chip is usually called an embedded DRAM from the standpoint of DRAM, and a merged DRAM with a logic (MDL) device from the standpoint of logic devices. Such a semiconductor device, however, is hereinafter uniformly referred to as an MDL device.

An MDL device can be formed by two methods, one an adaptation of a logic process based on a DRAM process and the other an adaptation of a DRAM process based on a logic process. However, these methods both have drawbacks in that a thermal budget due to a capacitor process of a DRAM is considerably larger than that due to a logic process, thus adversely affecting performance of logic, and also in that Ti or Co-silicide adapted to a logic process of below 0.25 μm is agglomerated to cause a junction leakage and a resistance increase of gate electrode.

Accordingly, in order to solve these problems, MDL devices have been conventionally manufactured the same way as in the logic process by adapting a flat capacitor adapted to DRAM of below 1M, to the DRAM capacitor.

The conventional method for manufacturing an MDL device will be now described with reference to FIGS. 1A to 1D.

Referring now to FIG. 1A, an isolation layer 2 is formed on a field region of a semiconductor substrate 1 in accordance with a known shallow trench isolation (STI). Then, an ion implantation process for a formation of well and a control of threshold voltage (Vt) is carried out in a state in which a mask 3 for ion implantation is formed on a certain portion of the substrate 1.

Referring to FIG. 1B, after the mask for ion implantation is removed, a gate oxide layer 4 and a gate conductive layer 5 are formed one by one. The layers 4 and are patterned to form gate electrodes 6. Herein, upon patterning the gate conductive layer 5 and the gate oxide layer 4, the layers 5 and 4 are left even on a substrate region on which a capacitor is formed. The resultant laminated layers serve as a dielectric and a node, respectively, of the MDL device manufactured, thus making up a flat capacitor.

Successively, a lightly doped drain (LDD) ion implantation and a halo ion implantation are conducted to the resultant of the substrate to form an LDD region 7 on the substrate surface between the gate electrodes 6 and a halo region 8 on the substrate surface below an edge portion of the gate electrode.

Referring to FIG. 1C, an insulating layer is deposited on the resultant of the substrate and then a blank etch is performed thereto thus to form a spacer 9 to both sidewalls of the gate electrode. Then, a source/drain ion implantation and an annealing process are performed thereto to form a source/drain region 10 on the substrate surface between the gate electrodes 6 including the spacer 9.

Referring to FIG. 1D, silicide 11 is formed on the surface of the gate electrode 6 according to the conventional process to form a transistor 12 and a flat capacitor 13 on a proper position of the substrate 1.

Then, although it is not shown in drawings, a series of post processes including a wiring process are performed so as to manufacture an MDL device.

However, although the conventional method described above can produce MDL devices without performance degradation by use of a logic process and through adaptation of a flat capacitor, the limitation of the chip size causes a limit of the capacity increase of the DRAM capacitor, so that it is substantially difficult to adapt a DRAM of 4M or higher.

SUMMARY OF THE INVENTION

Accordingly, the present invention has been made to solve the above-mentioned problems occurring in the prior art, and an object of the present invention is to provide a method for manufacturing an MDL device, which increases the capacity of a DRAM capacitor.

In order to accomplish this object, there is provided a method for manufacturing an MDL device, the method comprising the steps of: a) forming an oxide layer and a nitride layer one by one on a semiconductor substrate; b) forming a hole for exposing the substrate through patterning the nitride layer and the oxide layer; c) growing a silicon epitaxial layer on a portion of the substrate exposed by the hole and an adjacent portion of the nitride layer so that a facet is formed on the surface of the nitride layer; d) growing a thermal oxide layer on the finished silicon epitaxial layer; e) wet etching the thermal oxide layer so that only a growing portion thereof is left on the facet of the silicon epitaxial layer; f) repeating steps of c), d) and e) a predetermined number of times; g) removing the thermal oxide layer left on the facets of the repeatedly grown silicon epitaxial layers; h) serially forming a gate oxide layer and a gate conductive layer on the resulting substrate from step g); and i) forming a gate through patterning the gate conductive layer and the gate oxide layer, and forming a capacitor as well, comprising a storage node consisting of the substrate and the silicon epitaxial layer repeatedly grown so as to leave a facet of the silicon epitaxial layer, a dielectric layer consisting of the gate oxide layer, and a plate node consisting of the gate conductive layer.

Here, the silicon epitaxial layer is doped with an impurity, and the impurity doping is performed in such a manner that, during growing of the silicon epitaxial layer, impurity gas is added, or, after growth of the silicon epitaxial layer, ion implantation or POCl3 method is carried out. In the case of ion implantation, impurity ions are implanted at an angle between 5 and 60 degrees.

According to the present invention, a silicon epitaxial layer is repeatedly grown on a substrate, on which a capacitor will be formed, as to leave a facet of the silicon epitaxial layer, so that the capacity of the capacitor may be increased to form an MDL device with high-capacity DRAM.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings.

FIGS. 2A to 2G are end views according to the respective process, which explain a method according to an embodiment of the present invention for manufacturing a merged DRAM and logic device.

Figure 1A:
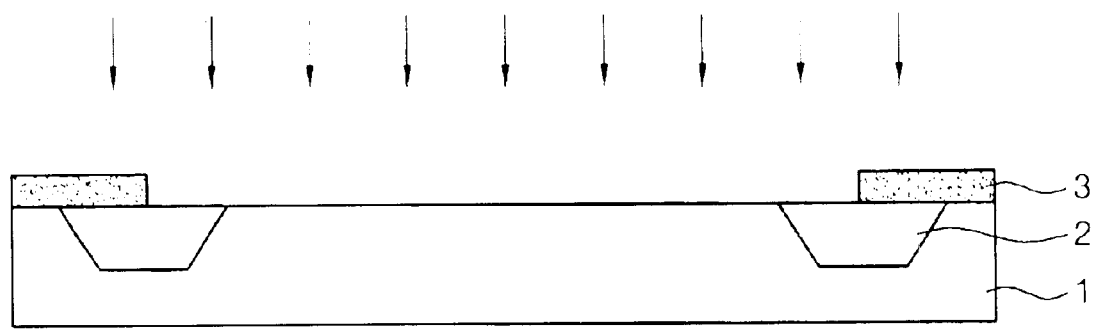
FIGS. 1A to 1D are end views according to the respective process, which explain a method for manufacturing a conventional merged DRAM and logic device.
Figure 1B:
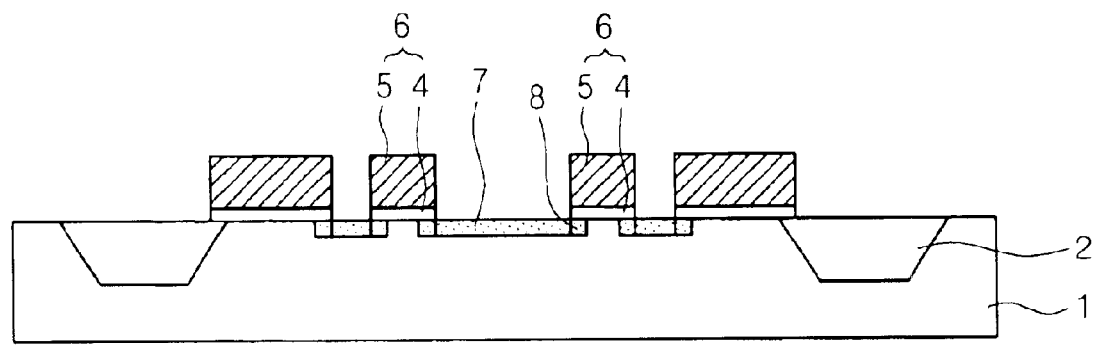
Figure 1C:
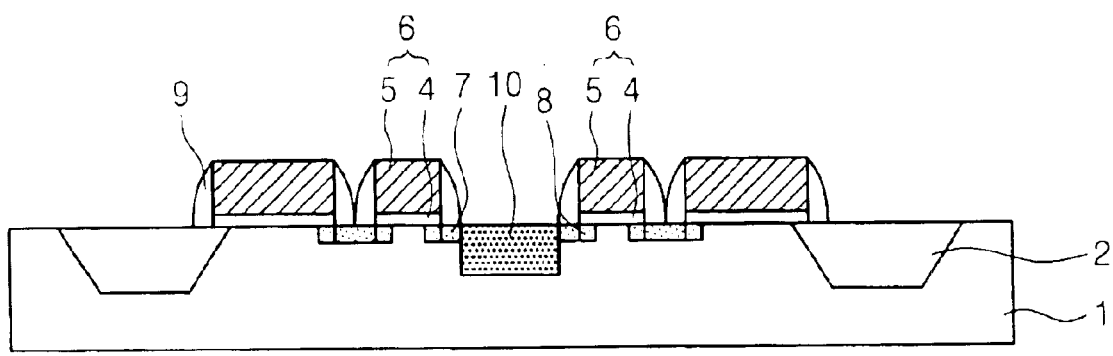
Figure 1D:
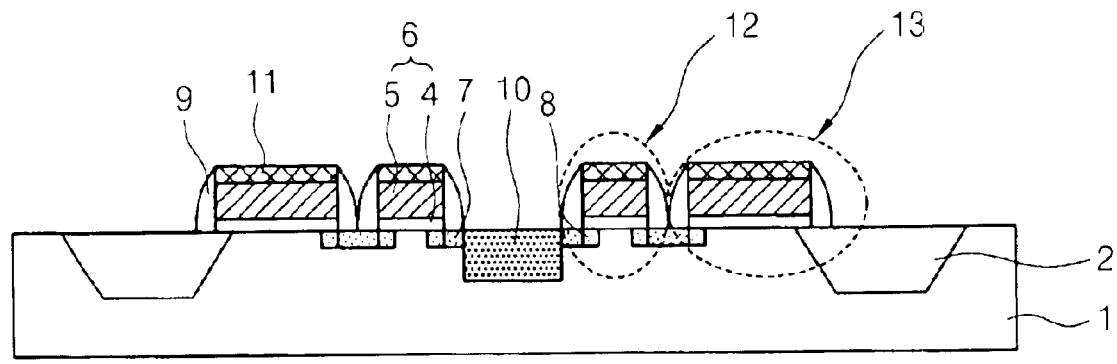
Figure 2A:
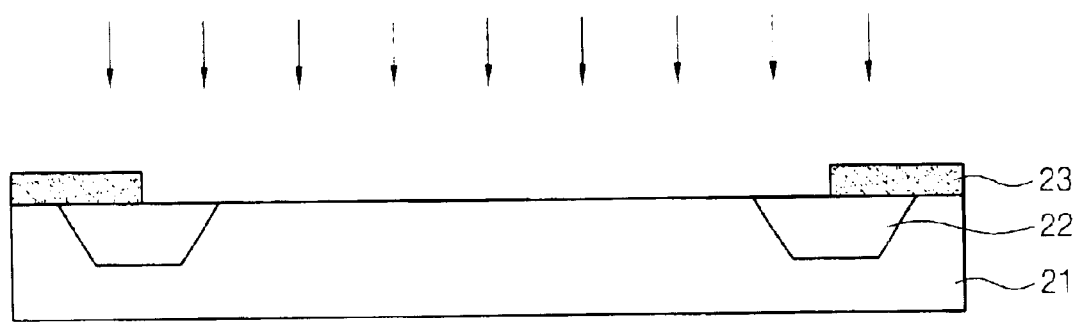
FIGS. 2A to 2G are end views according to the respective process, which explain a method according to an embodiment of the present invention for manufacturing a merged DRAM and logic device.

Referring to FIG. 2A, an isolation layer 22 for defining an active region is formed on a field region of a semiconductor substrate 21 according to the conventional STI process. Then, a mask 23 for ion implantation is formed on the substrate 21 and an ion implantation is carried out to form a well and to regulate threshold voltage Vt.

Figure 2B:
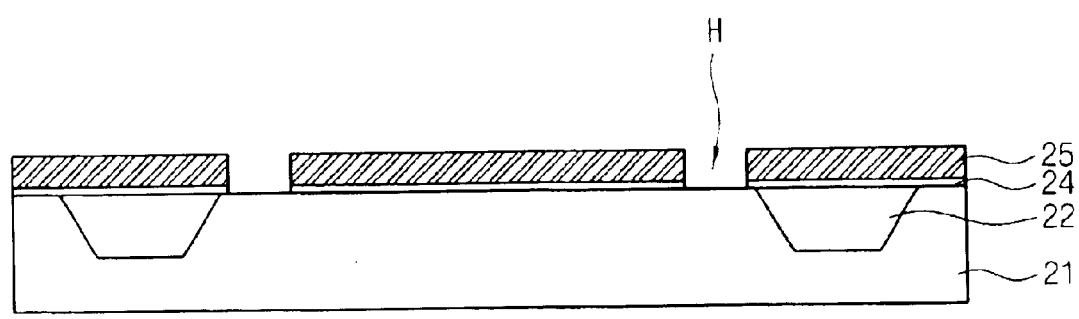

Referring to FIG. 2B, in the state that the mask for ion implantation is removed, an oxide layer 24 and a nitride layer 25 are serially deposited on entire area of the substrate 21. The resultant substrate is patterned to form a hole H for exposing a portion of the substrate, on which a silicon epitaxial layer will be formed at a subsequent process.

Here, the nitride layer 25 oxidizes the silicon epitaxial layer at subsequent process and serves as a barrier layer for oxidation and etching upon a wet etching. Instead of the nitride layer, the oxide layer may be used. In this case, the wet etching should be well controlled so as to minimize a loss of the isolation layer when removed. Accordingly, considering a process margin for the wet etching, it is preferable to deposit the nitride layer rather than the oxide layer. Also, it is possible to form a laminated layer of nitride layer, oxide layer and nitride layer.

Figure 2C:
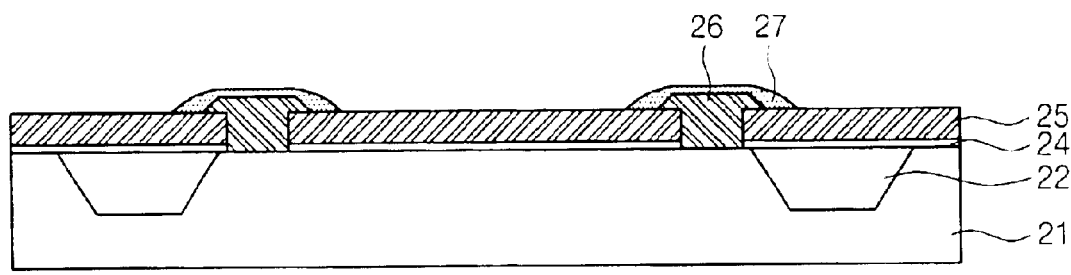

Referring to FIG. 2C, the silicon epitaxial layer 26 is grown on a portion of the substrate exposed by the hole H and the adjacent portion of the nitride layer according to a selective epitaxial growth process. Herein, the silicon epitaxial layer 26 is grown in such a manner that a facet is formed on the surface of the nitride layer, that is, a crystal plane of (111) different from the crystal plane of (100) is formed thereon. Then, a thermal oxide layer 27 is grown on the silicon epitaxial layer 26 grown as to form the facet.

Figure 2D:
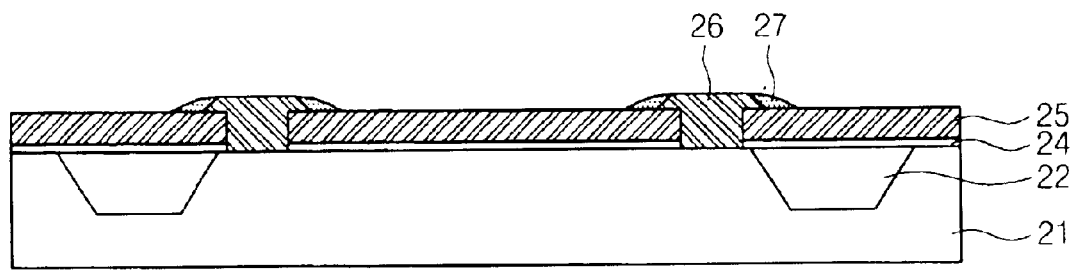

Referring to FIG. 2D, the thermal oxide layer 27 is wet etched in such a manner that a growing portion of the thermal oxide layer remains on (111) plane of the silicon epitaxial layer 26.

Figure 2E:
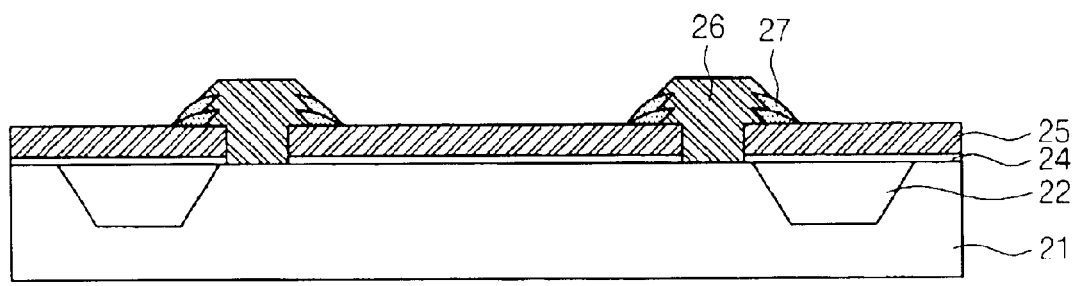

Referring to FIG. 2E, after growing the silicon epitaxial layer as to form the facet as described above, the processes for growing the thermal oxide layer, for wet etching the portion of the thermal oxide layer as to leave only a growing portion of the thermal oxide layer on the (111) plane are repeatedly carried out at least three times.

Figure 2F:
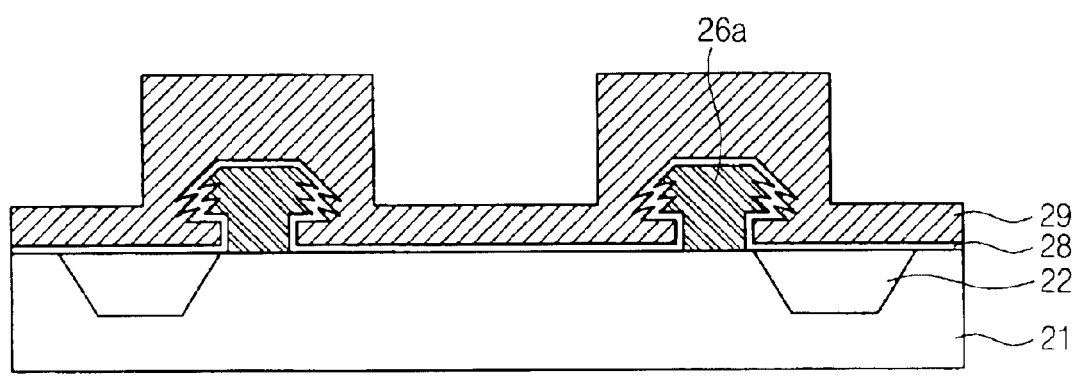

Referring to FIG. 2F, the resultant of the substrate processed by the previous step is wet etched to completely remove residual thermal oxide layer on (111) plane of the repeatedly grown silicon epitaxial layer, thereby forming a storage node 26a consisting of the substrate 21 and the silicon epitaxial layer.

Here, in order to use the silicon epitaxial layer as the storage node 26a, the silicon epitaxial layer should have proper electric conductivity, which requires a doping of impurity. Accordingly, during the growth of the silicon epitaxial layer, impurity gas is added so as to dope proper amounts of impurity thereto.

Further, in the case where the silicon epitaxial layer is grown only to itself without impurity doping, impurity is doped after the growth by use of POC13 method using a constant source diffusion by phosphorous oxide layer, or an ion implantation for impurity ion implanting at an angle, for example, between 5 and 50 degrees.

Subsequently, after the nitride layer and buffer oxide layer are removed, a gate oxide layer 28 and a gate conductive layer 29 are serially formed on the entire area of the substrate 21.

Figure 2G:
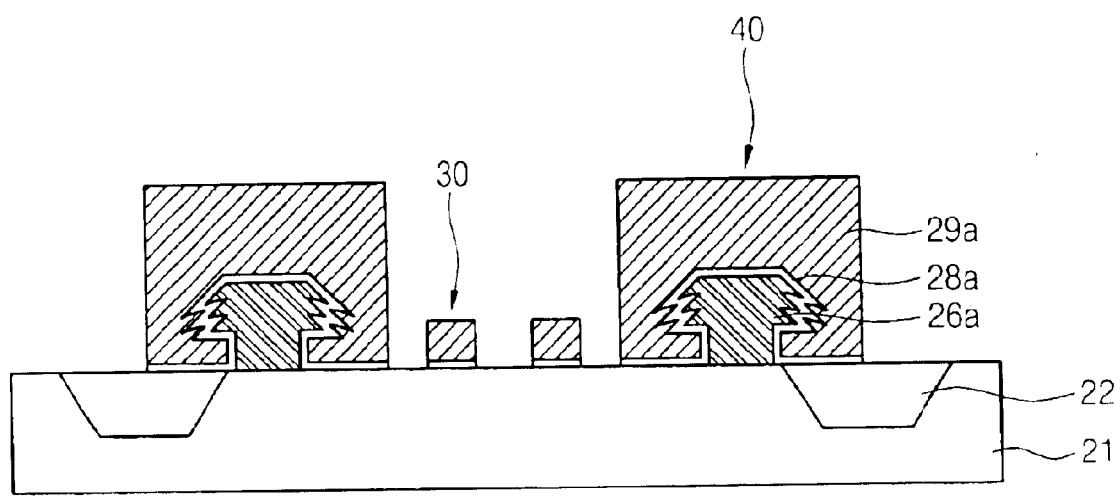

Referring to FIG. 2G, a gate 30 is formed on a proper position of the substrate 21 through patterning the gate conductive layer 29 and the gate oxide layer 28 according to a conventional process. At the same time, a capacitor 40 is formed which comprises the storage node 26a formed at previous step, a dielectric layer 28a consisting of the gate oxide layer and a plate node 29a consisting of the gate conductive layer.

Then, the MDL device of the present invention is manufactured by implementing a series of post processes including an ion implantation for spacer and source/drain and a wiring process.

In the method of the present invention as described above, the single crystal silicon has different oxidation rate according to its crystalline direction. It has been known that the oxidation rate of (111) plane of facet to that of (100) plane generally used would be about 1.68 times (see "Silicon processing for the VLSI Era", Vol. 1, page 212).

Thus, the silicon epitaxial layer is formed such that the facet thereof is formed only on the (100) plane, by the steps of growing the silicon epitaxial layer, growing the thermal oxide layer, removing the (100) plane of the thermal oxide layer as to leave the thermal oxide layer on (111) plane, and growing the silicon epitaxial layer in turn. For further reference, a tangent by an angle between (100) and (111) planes is the square root of 2 (about 1.414) so that when the silicon epitaxial layer is grown to 1000 Å, the thermal oxide layer is laterally grown by 414 Å by the facet.

Finally, according to the present invention, the silicon epitaxial layer is grown as to form facet thereof and thermal oxide layer is repeatedly grown and partially removed thus to obtain the growth of silicon epitaxial layer with a large surface area. The silicon epitaxial layer is used as a storage node, thus providing high-capacity capacitor. Herein, there does not require change of the logic process thus to obtain MDL device having high-capacity DRAM without performance degradation.

According to the present invention as described above, the storage node with a large surface area is provided by repeated growth of the silicon epitaxial layer with a facet formed thereon to obtain high-capacity capacitor, providing an MDL device having high-capacity dram without performance degradation during logic process.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for manufacturing a merged DRAM with logic (MDL) device, the method comprising the steps of: a) forming an oxide layer and a nitride layer one by one on a semiconductor substrate; b) forming a hole for exposing the substrate through patterning the nitride layer and the oxide layer; c) growing a silicon epitaxial layer on a portion of the substrate exposed by the hole and an adjacent portion of the nitride layer so that a facet is formed on the surface of the nitride layer; d) growing a thermal oxide layer on the grown silicon epitaxial layer; e) wet etching the thermal oxide layer so that only a growing portion thereof is left on the facet of the silicon epitaxial layer; f) repeating steps of c), d) and e) a predetermined number of times; g) removing the thermal oxide layer left on the facets of the repeatedly grown silicon epitaxial layers; h) serially forming a gate oxide layer and a gate conductive layer on the resulting substrate from step g); and i) forming a gate through patterning the gate conductive layer and the gate oxide layer, and forming a capacitor as well, comprising a storage node consisting of the substrate and the silicon epitaxial layer repeatedly grown as to leave a facet of the silicon epitaxial layer, a dielectric layer consisting of the gate oxide layer, and a plate node consisting of the gate conductive layer.

2. A method for manufacturing an MDL device as claimed in claim 1, wherein the silicon epitaxial layer is doped with an impurity.

3. A method for manufacturing an MDL device as claimed in claim 2, wherein the impurity doping is performed in such a manner that, during growing of the silicon epitaxial layer, impurity gas is added.

4. A method for manufacturing an MDL device as claimed in claim 2, wherein the impurity doping is performed in such a manner that, after growth of the silicon epitaxial layer, ion implantation or POC13 method is carried out.

5. A method for manufacturing an MDL device as claimed in claim 4, wherein the ion implantation is carried out in such a manner that impurity ions are implanted at an angle between 5 and 60 degrees.

* * * * *